United States Patent [19]

Marinescu

[11] 4,039,352
[45] Aug. 2, 1977

[54] HIGH EFFICIENCY THERMOELECTRIC GENERATOR FOR THE DIRECT CONVERSION OF HEAT INTO ELECTRICAL ENERGY

[75] Inventor: Matei Marinescu, Bucharest, Romania

[73] Assignee: Institutul de Cercetaro Energetice Industriale si Proictari Utilaje Energetice, Bucharest, Romania

[21] Appl. No.: 423,475

[22] Filed: Dec. 10, 1973

Related U.S. Application Data

[63] Continuation-in-part of Ser. No. 179,727, Sept. 13, 1971, abandoned.

[51] Int. Cl.$^2$ ............................................. H01V 1/30
[52] U.S. Cl. .................................. 136/205; 136/211; 310/306; 322/2 R
[58] Field of Search ....................... 136/211, 205, 236; 310/4; 322/2

[56] References Cited

U.S. PATENT DOCUMENTS

| 3,733,499 | 5/1973 | Deis et al. | 310/4 |
| 3,824,448 | 7/1974 | De Rivas | 322/2 |
| 3,844,843 | 10/1974 | Kay et al. | 136/236 |

FOREIGN PATENT DOCUMENTS

| 1,216,001 | 12/1970 | United Kingdom | 136/236 |

Primary Examiner—Harvey E. Behrend

[57] ABSTRACT

The present invention concerns a new thermoelectric generator, the operation of which is due to a new effect that takes place in a closed chain uniformly heated at an optimum temperature, the chain consisting of a semiconductor comprises between two different metals the difference of the work-function of which are related to the value of the optimum temperature quantitatively, through a certain formula given in the specification. For maximum electric power delivered, the concentration of the holes into the semiconductor must be of the order of $10^{18}$ n/cm$^3$, and the concentration of electrons into the same of the order of $10^8$ n/cm$^3$, at 20° C. Such a chain has in the absence of any temperature gradient, an efficiency near unity.

6 Claims, 6 Drawing Figures

HIGH EFFICIENCY THERMOELECTRIC GENERATOR FOR THE DIRECT CONVERSION OF HEAT INTO ELECTRICAL ENERGY

This application is a continuation-in-part of application Ser. No. 179,727, filed Sept. 13, 1971 now abandoned.

The invention provides a new type of thermoelectric generator furnishing electrical energy through direct conversion of heat from a single source which may be solar, nuclear, burned gases, fuel, etc.

The conversion of heat into electrical energy, by means of the new type of thermoelectric generator, takes place directly, without intermediate mechanical energy, with an efficiency greater than that obtainable by any other conventional methods known, and with a high degree of reliability and simplicity in construction.

There are a few known methods for direct conversion of heat into electrical energy. All of them, except one, the charge diffusion system, require two heat sources, namely, a hot and cold source (heat sink), and therefore attain efficiencies no greater than Carnot cycle efficiency.

Additionally, there are specific substantial heat-losses, inherent in each of these conventional methods, which further reduce efficiency, so that in the "magnetohydrodynamic" "MHD", energy conventional system, efficiency does not exceed 50 – 60% — and only with very great amount of power to be delivered, e.g. 500 MW.

In the thermoelectric generators based on the "Seebeck effect" efficiency does not exceed 15%. In the "charge diffusion" system (see English Pat. No. 1,173,605) there is only a single source of heat, hence efficiency can exceed the Carnot cycle efficiency; however, due to the fact that electrodes of refractory metals must be heated to very high temperatures (800° – 1000° C), so that thermo-ionic emission can take place, the heat-losses are large (as is well known, they are proportional to the temperature).

Furthermore, as the operation of this "charge diffusion" system depends on the diffusion current of charges particles in the plasma or semi-conductor medium placed between the refractory metal electrodes, along a path that must be many times greater than the mean free path of the charged particles the electrical conductivity of such a diffusion path and thus the resulting "diffusion current" are small, as consequence there being a very small delivered power. In combining a number of such cells in series and parallel to raise the power, the space occupied by such an assembly becomes cumbersome and non-economical.

Those two deficiencies, inherent in the "charge diffusion system" as we have seen, are eliminated by the present invention.

Firth of all, in the system of the present invention the two electrodes of the cell are not made of refractory metals, but are made only of such metals whose "work-function" are different from each other by a certain amount that depends, as will be shown, on the temperature at which the cell is designed to operate, so that with appropriate metals the cell can be operated at very low temperature.

The advantage of such low temperature of operation is evident since heat losses increase with temperature.

Secondly, as the operation of the system of the invention is not based on a "charge diffusion" process, the distance between the electrode of the cell may be on the order of some few microns, therefore smaller than the mean free path of the charged particles, instead of being many times greater as in the "charge diffusion" system. As a consequence, much greater current may be obtained, with an appreciable reduction of the volume of the cell at the same time.

The invention will be more readily understood by consideration of the accompanying drawing, in which.

Figure 1:
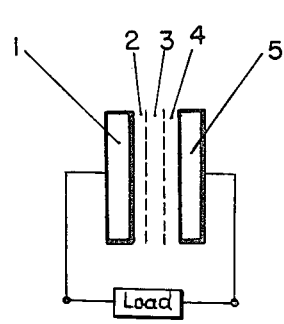
FIG. 1 is a schematic view cross-section through a first embodiment of cell in accordance with the invention.

Turning now to FIG. 1 there is shown a cell in which elements 1 and 5 are two circular identical inox-steel supports. On one face of one of the supports, for example, there are deposited by evaporation in vacuum thin films as follows:

2 is a thin film of metal, 3 is a thin film of a semiconductor, and 4 is a thin film of a metal, metals 2 and 4 having a predetermined difference of the two corresponding work-functions, such difference depending upon operating temperature of the cell and the nature of the semi-conductor. The thickness of the films are on the order of some few microns. The support 1 is pressed against the support 5 by opposed jaws (not shown) to insure a good electric contact between the films and both supports. In an exemplary embodiment the films 2, 3, and 4 may be of Al, Ge and Pt, respectively. Electric contact between the supports and the thin films lying between them is insured by sealing the two metallic supports all round their edges with an electrical insulated laquer like bakelite or sodium silicate or the like, which solidifies when exposed to air for some time at room temperature.

If such an assembly is heated uniformly to the prescribed operating temperature T, a resultant difference of potential, of some mV in the particular case given as an example above, will appear across terminals 6 and 7, the metal with the higher value of the work-function being the positive pole; if the chain thus produced is closed by an external load, an electric current will flow around the loop thus formed. The maximum power delivered to the load will be given for a concentration of holes of the order of $10^{18}$ n/cm$^3$ and of electrons of the order of $10^8$ n/cm$^3$ into the semiconductor at 20° C. The two wires that complete the circuit between the supports and the terminal are, of course, of the same metal to prevent any e.m.f. due to the Seebeck effect that may otherwise appear as a consequence of the temperature gradient between the cell and the external load. In the above construction the semi-conductor film, which is formed by being deposited by evaporation in vacuum, is of a polycrystalline structure.

The heat souce is uniformly distributed all round the cell as by being inserted into an oven at high temperature, or even when placed in a room at room temperature. The heat impinges all round the device.

The electrical energy generated by the device is drawn off through two copper wires, whose two terminals are soldered to the two metallic supports by a silver laquer (epoxy technology), the other two terminals of the copper wires being connected to the load.

Figure 2:
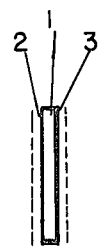
FIG. 2 is a schematic view in cross-section through second embodiment of cell in accordance with the invention.

Another type of construction is shown in FIG. 2. The cell here shown consists of a single crystal of a semiconductor cut as a circular disc 1 as thin as possible; on one face of disc 1 there is deposited through evaporation in vacuum a thin film 2 of one kind of metal, the other face of disc 1 being covered with a thin film 2 of another kind of metal formed by evaporation in vacuum, the difference between the corresponding work-function of the two metals 2 and 3 having a value determined by the operating temperature. Each of the above cell structure may employ either a poly or monocrystalline semi-conductor; with either structure there may be produced batteries, by assembling a plurality of the cells in series or parallel or both.

Figure 3:
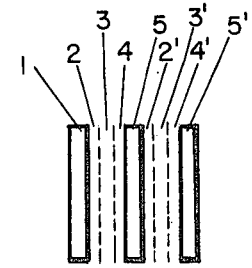
FIG. 3 is a schematic view in cross-section through a third embodiment in accordance with the invention.

In FIG. 3 there is shown an assembly consisting of two identical cells of the polycrystalline type, mounted in series, in which 1 is the first support, 2, 3 and 4 being respectively:

a first metal, a semi-conductor, and a second metal of the first cell, 5 is the second support 2', 3' and 4' being respectively:

first metal, semi-conductor, second metal of the second cell and 5' being the third support. In some assemblies of this type the support 5 can be omitted. The e.m.f. of the assembly of FIG. 3 is twice the e.m.f. of each of the cells if these cells are identical with respect to the nature of the metals and the semi-conductor employed.

Figure 4:
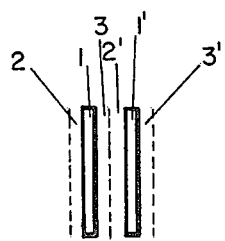
FIG. 4 is a schematic view in cross-section through a forth embodiment in accordance with the invention.

A series assembly of two identical cells of the second type (monocrystalline), is whon in FIG. 4. In such figure 1 and 1' are the two monocrystalline semi-conductors 2 and 3 the first and second metals of the first cell, respectively, and 2' and 3' the first and second metal of the second cell, respectively.

Two or more identical cells are mounted in series very much like storage lead batteries: that is the pole (+) of one cell is connected to the pole (−) of the next, and so on. The connections are made by soldering copper wires to the metallic supports of each cell, or simply by pressing the cells directly, against each other, by means of an elastic clamp for example. Again, two or more identical cells are mounted in parallel very much like storage lead batteries, that is to say all poles (+) of the cells are soldered together by copper wires and similarly all poles (−).

We will now explain, from a theoretical point of view, how an e.m.f. may apear in such circuit as those described above. This will be done considering the closed chain of FIG. 5, reproducing schematically our cells in their essential features.

Figure 5:
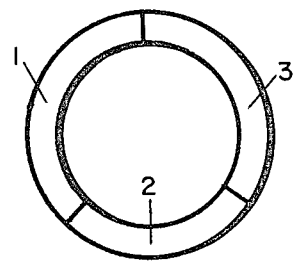
FIG. 5 is a view in plan of a generator in accordance with the invention.

As shown in FIG. 5, the chain consists of three sections namely;

section 1 is a metal having a work-function $\theta_1$; section 2 is a semi-conductor having a work-function - $\theta_2$ and section 3 is a metal with a work-function $\theta_3$. At the three junctions: 1-2, 2-3, 3-1, we have contact potential differences, namely: $V_1^2 = V_1 - V_2$, $V_2^3 = V_2 - V_3$, $V_3^1 = V_3 - V_1$, where $V_1$, $V_2$, $V_3$ are the potentials of each of the three sections with respect to a common potential taken arbitrarily as zero potential. Accordingly to Volta's law, the resultant e.m.f. E along the chain maintained at an uniform temperature (zero temperature gradient along the chain) will be:

$$E = \frac{V_1^2}{(V_1-V_2)} + \frac{V_2^3}{(V_2-V_3)} + \frac{V_2^1}{(V_3-V_1)} = 0$$

However, $E \neq 0$, if section 2 is a semi-conductor and sections 1 and 2 are two different metals having a predetermined value of the difference between their workfunctions, for a given critical temperature $T_c$ permitting the establishment of a "compensated diffusion" process at the junctions 1-2 and 2-3. Let us consider in more detail the expression of E. According to some of our previous works:

1. M. Marinescu, C.R. Acad. Sci. Paris, 262 1966, page 1762
2. M. Marinescu, C.R. Acad. Sci Paris, 268 1969, page 1492
3. M. Marinescu, R.G.E.I. 77, Nr. 11, page 1064
4. M. Marinescu, Le troisieme Congress pour les piles de combustion — Bruxelles, pages 52-55

We have:

$$V_1^2 = \sigma_1^2 - kT \ln \frac{P_1}{P_2'}$$

$$V_2^3 = \sigma_2^3 - kT \ln \frac{p_2''}{P_3}$$

$$V_3^1 = \sigma_3^1 - kT \ln \frac{P_3}{P_1} = \sigma_3^1$$

where:

$K$ = Boltzman constant
$T$ = absolute temperature of the chain;
$P_1 = P_3$ = concentration of holes in the metals, respectively;
$P'_2 \neq P''_2$ = concentration of holes in the semiconductors near the junction 1-2 and 2-3, respectively; these last two concentrations are different from the concentration of the holes in the bulk of the semi-conductor, due to the "compensated diffusion" process at these two junctions, a process described in our previous works.

From the above relations, it follows that:

$$E = V_1^2 + V_2^3 + V_3^1 = kT \ln \frac{P_2'}{P_2''}$$

as $$\theta_1^2 + \theta_2^3 + \theta_3^1 \neq 0$$

the "compensated diffusion" theory also shown that $$E = kT \ln \frac{P_2'}{P_2''} = kT \ln \frac{1 + \sqrt{1 + \alpha e^{-2\Theta_1/hT}}}{1 + \sqrt{1 + \alpha e^{-2\Theta_3/hT}}},$$

with $\alpha = \frac{Pn \cdot Nm}{(p_2 - n_2)^2}$ where $p_m$, $n_m$ are the concentration of holes and electrons in the metals, and $p_2$, $n_2$ the concentration of holes and electrons in the bulk of the semi-conductor, respectively.

For given values of $\alpha << 1$, $\theta$, and $\theta_3$, E has a "maximum" value $E_m$ for a given value of T (critical operation value), as can be seen by derivation of E with respect to T. The value of $E_m$ is given by $E_m = \alpha \theta_1 - \theta_3) = kTc \ln p'_2/p'_2$ and the critical operation temperature $$Tc = \frac{a(\sigma_1 - \sigma_3)}{k\ln(p'2/p''2)}$$

If T exceeds this critical value (Tc), the "compensated diffusion" degenerates into the "charge diffusion" process, when $E=O$, as the means free path of the charged particles is greater than the thickness of the semi-conductor film or the distance between the two films of the thin mettalic electrodes.

FIG. 5 shows as an example the installation of such a thermoelectric generator having two cells of the polycrystalline type mounted in series, in the manner described above, and having a source of heat natural gases or partially burned gases.

If over a first series of three thin films deposited on one of the metallic supports, there will be deposited a second series of three thin films, so that over the last metallic film of work-function "$\theta_1$" of the first series, there will be deposited the metallic film of the second series, having the work-function $\theta_2$, that kind of disposition of the successive films will produce a series assembly of two identical cells. The same mode of disposition may be repeated for a third cell and so on, producing a series assembly of the whole.

Figure 6:
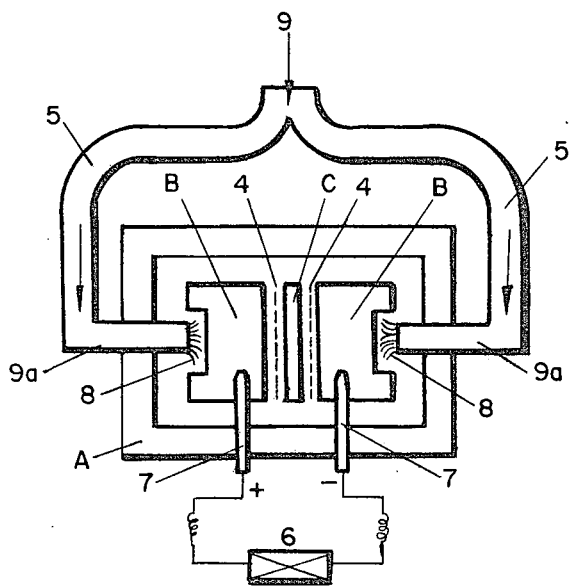
FIG. 6 is a view in vertical section of an installation incorporating such generator.

In FIG. 6, the different parts of the installation can thus be seen as well as their mode of assembly. In such installation, 1 is an oven made of ceramic material, which thermally insulates the generator from the exterior media. Elements B are metallic supports of inox-steel having plane parallel interior surfaces, elements B transmitting the heat to the active materials and collecting the current. 3 is an intermediate support providing for the series assembly of two identical individual cells 4. Cells 4 are made of thin films of deposited active substances, and consist of two different metals with a semi-conductor between tehm. 2 are pipes for the abduction of gases. 6 is the exterior electrical load. 7 are connecting terminals between metallic supports and the exterior load. 8 are burning flames to raise the temperatures of the generator to the prescribed value.

Among the chief advantages of the new thermoelectric generator are: high efficiency, low cost, simplicity of construction, and high degree of ability in operation.

Although the invention is illustrated and described with reference to a plurality of preferred embodiments thereof, it is to be expressly understood that it is in no way limited to the disclosure of such a plurality of preferred embodiments, but is capable of numerous modifications within the scope of the appended claims.

What is claimed is:

1. In a thermoelectric generator unit for converting heat directly from a single heat source into electrical energy, at least one active cell spaced from the heat source and comprising two identical metallic terminal supports having sandwiched therebetween, in intimate contact over their entire surface with each other and with the supports, first, second and third successive thin films, each of the films having a thickness of a few microns, the first and third ones of the films being metals that respectively have different work functions $\theta_1$ and $\theta_3$, the second film being of semiconductor material having a concentration of holes of the order of $10^{18}n/cm^3$ and of electrons of the order of $10^8n/cm^3$ at 20° C, and means including a single heat source completely surrounding the cell for uniformly heating the cell to a temperature $T \leq T_c$, where $$Tc = \frac{a(\sigma_1 - \sigma_3)}{k\ln\frac{(P'_2)}{(P''_2)}},$$

$k$ is Boltsman's constant, $(P_2') T = T_c$ is the concentration of holes in the second film adjacent its junction with the first film, $(P_2'') T = T_c$ is the concentration of holes in the second film adjacent its junction with the third film, $$a = \frac{Pm - nm}{(P_2 - n_2)^2} \leq 1,$$

$P_m$ and $n_m$ are respectively the concentrations of holes the concentrations of holes and electrons in the bulk of the semiconductor material.

2. A thermoelectric generator unit according to claim 1, comprising a plurality of said cells connected in series.

3. A thermoelectric generator unit according to claim 1, comprising a plurality of said cells connected in parallel.

4. A thermoelectric generator unit according to claim 1, wherein the three thin films of each cell are successively deposited by evaporation in a vacuum on a surface of one of the terminal supports.

5. A thermoelectric generator unit as claimed in claim 1, in which the first and third films are deposited by evaporation in a vacuum on opposed planes or faces of the second film.

6. A thermoelectric generator unit according to claim 2, in which the cells are sequentially arranged with first and second ones of the metallic supports disposed at opposite ends thereof, in which the heating means completely surrounding the cell comprises an oven of ceramic material for providing thermal insulation of the cells, and in which the single heat source extends through opposed walls of the oven to terminate adjacent the respective first and second metallic supports.

* * * * *